(12) United States Patent
Sugimoto et al.

(10) Patent No.: US 7,749,897 B2
(45) Date of Patent: Jul. 6, 2010

(54) METHOD OF MANUFACTURING SEMICONDUCTOR DEVICE

(75) Inventors: Ken Sugimoto, Kawasaki (JP); Yoshiyuki Ohkura, Kawasaki (JP); Hirofumi Watatani, Kawasaki (JP); Tamotsu Owada, Kawasaki (JP); Shunn-ichi Fukuyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/219,271

(22) Filed: Jul. 18, 2008

(65) Prior Publication Data

US 2008/0305645 A1 Dec. 11, 2008

Related U.S. Application Data

(62) Division of application No. 11/358,715, filed on Feb. 22, 2006, now abandoned.

(30) Foreign Application Priority Data

Nov. 29, 2005 (JP) ............................. 2005-344263

(51) Int. Cl.
*H01L 21/4763* (2006.01)
(52) U.S. Cl. ........................... 438/638; 257/E21.252
(58) Field of Classification Search .......... 257/E21.252, 257/E21.256, E21.257; 438/629, 636–639, 438/640, 667, 668, 672, 675, 700, 701, 713
See application file for complete search history.

(56) References Cited

U.S. PATENT DOCUMENTS

| 6,103,456 | A | * | 8/2000 | Tobben et al. ................ 430/317 |
| 6,319,815 | B1 | | 11/2001 | Iguchi et al. |
| 6,323,123 | B1 | * | 11/2001 | Liu et al. ..................... 438/638 |
| 6,455,417 | B1 | | 9/2002 | Bao et al. |
| 6,562,544 | B1 | * | 5/2003 | Cheung et al. ............... 430/313 |
| 6,790,770 | B2 | * | 9/2004 | Chen et al. ................... 438/637 |
| 6,853,043 | B2 | * | 2/2005 | Yeh et al. ..................... 257/437 |
| 7,109,119 | B2 | * | 9/2006 | Bao et al. ..................... 438/700 |

(Continued)

FOREIGN PATENT DOCUMENTS

JP 57-192032 A 11/1982

(Continued)

OTHER PUBLICATIONS

Taiwanese Office Action dated Apr. 10, 2009, issued in corresponding Taiwanese Application No. 095105920.

(Continued)

*Primary Examiner*—W. David Coleman
*Assistant Examiner*—Latanya Crawford
(74) *Attorney, Agent, or Firm*—Westerman, Hattori, Daniels & Adrian, LLP

(57) ABSTRACT

A method of manufacturing a semiconductor device comprising a wiring structure that includes a vertical wiring section is disclosed. The method comprises a step of forming an interlayer insulation film made of a low dielectric constant material on a wiring layer, a step of forming a silicon oxide film by CVD using $SiH_4$ gas and $CO_2$ gas on the interlayer insulation film, a step of forming a chemically amplified resist film to cover the silicon oxide film, and a step of forming a first opening in a position on the chemically amplified resist film where the vertical wiring section is to be formed.

4 Claims, 9 Drawing Sheets

U.S. PATENT DOCUMENTS

| | | | |
|---|---|---|---|
| 7,364,836 B2 * | 4/2008 | Liu et al. | 430/311 |
| 7,550,377 B2 * | 6/2009 | Liu et al. | 438/627 |
| 2001/0023990 A1 | 9/2001 | Yokoyama et al. | |
| 2003/0001273 A1 * | 1/2003 | Steiner et al. | 257/760 |
| 2003/0227087 A1 * | 12/2003 | Kakamu et al. | 257/758 |
| 2004/0087139 A1 | 5/2004 | Yeh et al. | |
| 2004/0087164 A1 | 5/2004 | Bao et al. | |
| 2004/0166666 A1 | 8/2004 | Usami | |
| 2004/0185674 A1 | 9/2004 | M'Saad et al. | |
| 2005/0001323 A1 | 1/2005 | Watanabe et al. | |
| 2005/0124168 A1 | 6/2005 | Nagahara et al. | |
| 2006/0063376 A1 | 3/2006 | Lee et al. | |

FOREIGN PATENT DOCUMENTS

| | | |
|---|---|---|
| JP | 2004-06627 | 1/2004 |
| JP | 2004-14841 A | 1/2004 |
| TW | 589712 B | 6/2004 |

OTHER PUBLICATIONS

Chinese Office Action dated Apr. 18, 2008, issued in corresponding Chinese Application No. 2006100547593.

Japanese Office Action mailed Jan. 12, 2010, issued in corresponding Japanese Application No. 2005-344263.

Japanese Office Action dated Mar. 30, 2010, issued in corresponding Japanese Patent Application No. 2005-344263.

* cited by examiner

FIG.9

|  | COMPOSITION (%) | | | |
| --- | --- | --- | --- | --- |
|  | Si | O | C | N |
| EXAMPLE 1 | 22.40 | 66.80 | 10.05 | 0.76 |
| COMPARATIVE EXAMPLE 1 | 20.50 | 68.90 | 9.97 | 0.70 |
| COMPARATIVE EXAMPLE 2 | 21.50 | 65.20 | 9.99 | 3.39 |

FIG.10

|  | RELATIVE DIELECTRIC CONSTANT | DENSITY (g/cm$^3$) |
| --- | --- | --- |
| EXAMPLE 1 | 4.04 | 2.28 |
| COMPARATIVE EXAMPLE 1 | 4.33 | 2.24 |
| COMPARATIVE EXAMPLE 2 | 4.11 | 2.17 |

US 7,749,897 B2

METHOD OF MANUFACTURING SEMICONDUCTOR DEVICE

CROSS-REFERENCE TO RELATED ART APPLICATIONS

This application is a Divisional of application Ser. No. 11/358,715, which is based upon and claims the benefit of priority from the prior Japanese Patent Application No. 2005-344263, filed on Nov. 29, 2005, the entire contents of which are hereby incorporated by reference.

BACKGROUND OF THE INVENTION

1. Field of the Invention

The present invention relates to a method of manufacturing a semiconductor device having a laminated wiring structure.

2. Description of the Related Art

In recent years, along with expansion of functions and improvement of performance of semiconductor devices, the number of transistors mounted on a chip has been significantly increased while reducing the chip size. As such highly-integrated semiconductor devices with the reduced chip size require more wirings, wiring structures having higher density have been developed.

However, increasing wiring structure density results in an increase of wiring capacity C due to reduction of the distance between wirings, an increase of wiring resistance R due to reduction of the wiring width, and a consequent increase of RC wiring delay.

One solution for these problems is to form wiring structures using a dual damascene process, where Cu wiring is used in order to reduce the wiring resistance R and eventually reduce wiring delay. The dual damascene process is for forming vias as vertical wiring and wiring of wiring layers at the same time. More specifically, the dual damascene process is for forming via holes and wiring grooves, filling the via holes and the wiring grooves with Cu, and flattening the surface of Cu by chemical mechanical polishing (CMP).

For the purpose of reducing wiring capacity, films made of a low dielectric constant material (so-called "low-k films") are used as interlayer insulation films. The low-k films have a lower dielectric constant than silicon oxide films ($SiO_2$, relative dielectric constant: 4.3) that have been conventionally used as interlayer insulation films. Examples of low-k films include inorganic insulation films of SiOC, porous silica, etc., and organic insulation films of polyimide series and Teflon™ series.

The low-k films not only have a lower relative dielectric constant but also have a lower density than the silicon oxide films. Accordingly, the low-k films easily absorb process gases, etching gases, water, and the like used during film formation, and hold a much larger amount of gas than the silicon oxide films. The gas held in the low-k films expand during the later heat treatment. The expanded gas exerts a very high stress on the low-k films and the wiring layers, and might cause breakage.

TEOS silicon oxide films (hereinafter referred to as "TEOS films") are used to cover the surface of the low-k films in order to prevent absorption of gases, etc., into the low-k films. The TEOS films are denser than the low-k films, and thus prevent the process gases, etc., from entering the low-k films from the outside.

In the process of forming fine wiring structures in the low-k films, resist films made of chemically amplified photoresist materials are used. For example, in the case of the positive type, when the chemically amplified photoresist materials are exposed to light, acid substances are produced to form latent images. Then, when the acid substances are subjected to heat treatment, the acid substances act on and degrade a dissolution preventing agent so as to render the latent images soluble by an alkaline developer. If low-k films are used as interlayer insulation film, gas contained in the low-k films produces basic substances, which neutralize acid substances present in the latent image area of the resist films. The amount of the acid substances thus becomes too small to act on the dissolution preventing agent, resulting in poor development of the photoresist film, i.e., so-called "resist poisoning" (or simply "poisoning").

Patent Document 1 discloses a laminated structure having a TEOS film for preventing diffusion of basic substances. According to Patent Document 1, as shown in FIG. 1, a laminated structure 100 includes TEOS films 103 disposed between low-k films 104 and silicon nitride films 102 so as to prevent the low-k films 104 from coming in contact with nitrogen and ammonia gas used for forming the silicon nitride films 102, thereby preventing resist poisoning.

<Patent Document 1> Japanese Patent Laid-Open Publication No. 2004-6627

Generally, TEOS films are formed by vaporizing liquid TEOS as a raw material, and mixing the vaporized TEOS with oxygen ($O_2$) gas serving as an oxidizer, with use of plasma chemical vapor deposition (CVD) devices. In a processing chamber of a typical plasma CVD device, mixed gas of TEOS and $O_2$ gas is ionized by plasma so as to cause a reaction on the surface of a heated wafer. As a result of the reaction, a TEOS film is formed. That is, plasma CVD devices used for forming TEOS films need to have vaporization mechanisms to vaporize liquid TEOS, and therefore have more complex mechanisms than plasma CVD devices that only use gas as a raw material. This means that production of semiconductor devices including such TEOS films requires higher device costs and higher manufacturing costs.

SUMMARY OF THE INVENTION

The present invention may solve at least one problem described above. Specifically, the present invention is directed to a method of manufacturing a semiconductor device with low manufacturing cost while forming a fine wiring structure.

According to an aspect of the present invention, there is provided a manufacturing method of a semiconductor device comprising a wiring structure that includes a vertical wiring section. This method comprises a step of forming an interlayer insulation film made of a low dielectric constant material on a wiring layer, a step of forming a silicon oxide film by CVD using $SiH_4$ gas and $CO_2$ gas on the interlayer insulation film, a step of forming a chemically amplified resist film to cover the silicon oxide film, and a step of forming a first opening in a position on the chemically amplified resist film where the vertical wiring section is to be formed.

According to this method, the silicon oxide film is formed on the interlayer insulation film by CVD using $SiH_4$ gas and $CO_2$ gas. Since gases containing nitrogen, such as $NH_3$ gas and $N_2$ gas, are not used as raw materials for the silicon oxide film, the interlayer insulation film is prevented from being penetrated by the gases containing nitrogen and ions therein during formation of the silicon oxide film. The silicon oxide film itself contains substantially no nitrogen, and therefore prevents $NH_3$ gas, $N_2$ gas, and ions ionized from these gases from passing therethrough. That is, the silicon oxide film prevents generation of basic substances derived from nitrogen inside the interlayer insulation film. Thus, resist poisoning in the resist film is prevented, and a fine wiring structure is formed.

Moreover, since the silicon oxide film is formed using $SiH_4$ gas and $CO_2$ gas, a CVD device used for forming the silicon oxide film does not need to have a vaporizing mechanism, unlike CVD devices used for forming TEOS films, which need to have vaporizing mechanisms for vaporizing liquid TEOS as a raw material for the TEOS films. Therefore, the CVD device used for forming the silicon oxide film can also be used for forming other films such as antireflection films. In other words, the versatility of the CVD device used for forming the silicon oxide film is expanded. As a result, manufacturing costs are reduced.

According to another aspect of the present invention, there is provided a method of manufacturing a semiconductor device comprising a wiring structure formed using a dual damascene process. This method comprises a step of sequentially forming a first interlayer insulation film and a second interlayer insulation film, at least one of the first and second interlayer insulation films being made of a low dielectric constant material, a step of forming a silicon oxide film by CVD using $SiH_4$ gas and $CO_2$ gas on the second interlayer insulation film, a step of forming a first chemically amplified resist film to cover the silicon oxide film, a step of forming a pattern of an opening on the first chemically amplified resist film, a step of forming a via hole to extend through the silicon oxide film, the first interlayer insulation film, and the second interlayer insulation film, while using the pattern formed on the first chemically amplified resist film as a mask, a step of filling the via hole with a filler, a step of forming a second chemically amplified resist film to cover the second interlayer insulation film and the filler, a step of forming a pattern of a wiring groove in an area of the second chemically amplified resist film including the via hole, a step of forming the wiring groove by etching the second interlayer insulation film while using the second chemically amplified resist film as a mask, and a step of filling the via hole and the wiring groove with a conductive material.

According to this method, the silicon oxide film is formed on the second interlayer insulation film made of the low dielectric material by CVD using $SiH_4$ gas and $CO_2$ gas. As with the above-described method, this method can prevent resist poisoning and can form a fine wiring structure. Moreover, since the silicon oxide film is formed using $SiH_4$ gas and $CO_2$ gas, a CVD device used for forming the silicon oxide film does not need to have a vaporizing mechanism, unlike CVD devices used for forming TEOS films, which need to have vaporizing mechanisms for vaporizing liquid TEOS as a raw material for the TEOS films. Therefore, the CVD device used for forming the silicon oxide film can also be used for forming other films such as antireflection films. In other words, the versatility of the CVD device used for forming the silicon oxide film is expanded. As a result, manufacturing costs are reduced.

BRIEF DESCRIPTION OF THE DRAWINGS

FIG. 9 is a table showing composition of the silicon oxide films of Example 1 and Comparative Examples 1 and 2;

FIG. 10 is a table showing properties of the silicon oxide films of Example 1 and Comparative Examples 1 and 2;

DETAILED DESCRIPTION OF THE PREFERRED EMBODIMENT

The following description provides exemplary embodiments of the present invention with reference to the accompanying drawings. It is to be noted that a silicon oxide film formed by using $SiH_4$ gas and $CO_2$ gas is referred to as "SiO film" in the following description.

First Embodiment

FIGS. 2-7 illustrate a manufacturing process of a semiconductor device according to a first embodiment of the present invention. The following describes a manufacturing method of a semiconductor device of the first embodiment with reference to FIGS. 2-7.

Figure 1:
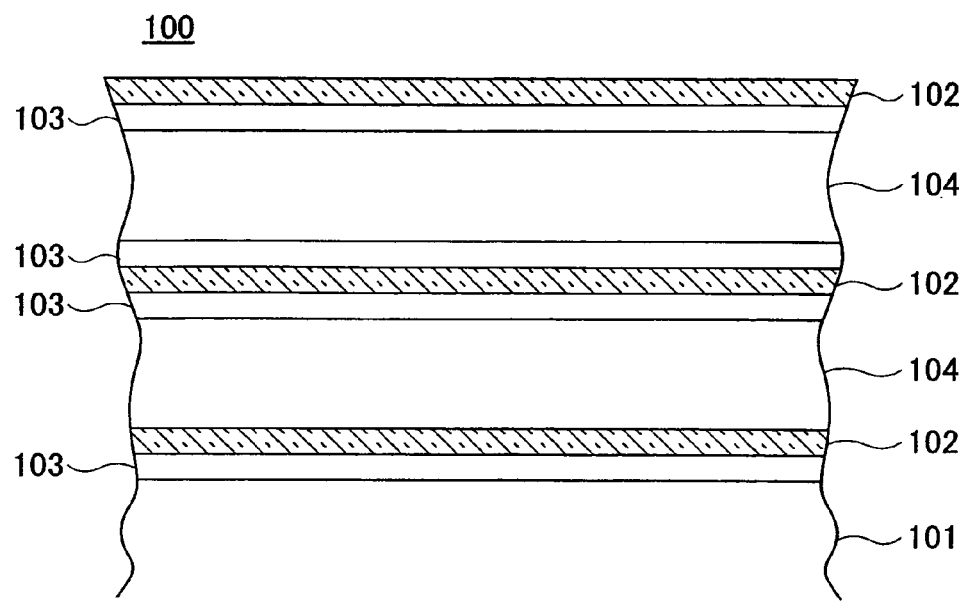
FIG. 1 illustrates a part of a manufacturing process of a related-art semiconductor device.
Figure 2:
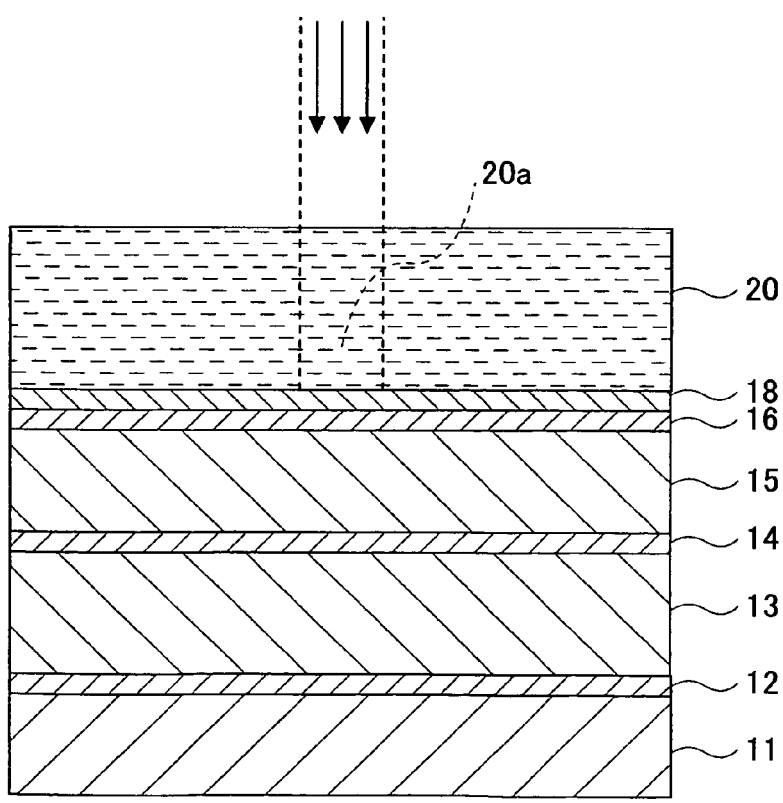
FIGS. 2-7 illustrate a manufacturing process of a semiconductor device according to a first embodiment of the present invention.

In the step shown in FIG. 2, a cap layer 12, a first interlayer insulation film 13, an SiO film 14, a second interlayer insulation film 15, an SiO film 16, and an antireflection film 18 are formed on a wiring layer 11 in this order. In this embodiment, the cap layer 12 is an SiC film (having a thickness of, e.g., 70 nm), and the first and second interlayer insulation films 13 and 15 are SiOC films (having a thickness of, e.g., 550 nm and a thickness of, e.g., 370 nm, respectively) as low-k films (the low-k films as used herein are defined as films made of a dielectric material having a relative dielectric constant lower than 4.3). These layers are formed with use of CVD devices and sputtering devices.

The first and second interlayer insulation films 13 and 15 may be any low-k films that are well known in the art. Non-exclusive examples of low-k films include inorganic insulation films, such as SiOF and BSG ($SiO_2$—$B_2O_3$) films (relative dielectric constant: 3.5-3.7), films made of porous silica (relative dielectric constant: 2.4), such as Nano Clustering Silica (NCS) (Catalysts & Chemicals Industries Co., Ltd.) and Porous SiLK™ Y (Dow Chemical Company), and films made of organosiloxane, such as porous Black Diamond™ (Applied Materials, Inc.), CORAL™ (Novellus Systems, Inc.) (relative dielectric constant: 3.2), and HOSP™ (Honeywell Electronic Materials Inc) (relative dielectric constant: 2.5).

The SiO films 14 and 16 are formed using a plasma CVD device while being supplied with mixed gas of $SiH_4$ and $CO_2$ as a raw material. More specifically, SiO films 14 and 16 are formed under a condition where $SiH_4$ gas flow rate is 30 sccm-100 sccm, $CO_2$ gas flow rate is 5000 sccm-20000 sccm, pressure inside a processing chamber is 400 Pa-933 Pa (3 Torr-7 Torr), plasma input power is 100 W-1000 W, and wafer heating temperature is 350° C.-500° C. By supplying $SiH_4$ gas mixed with $CO_2$ gas at a flow rate much higher than $SiH_4$ gas, the SiO films 14 and 16 containing substantially no nitrogen can be obtained.

The ratio between the flow rate of $SiH_4$ gas and $CO_2$ gas, i.e., $SiH_4$ gas flow rate:$CO_2$ gas flow rate, in a standard condition is preferably in a range of 1:100-1:400 in view of the quality of the SiO films 14 and 16. The reasons why $SiH_4$ gas flow rate:$CO_2$ gas flow rate in the above range is preferable are as follows: When $SiH_4$ gas flow rate:$CO_2$ gas flow rate in a standard condition is 1:100 or greater, Si of $SiH_4$ gas is fully oxidized by $CO_2$ gas to improve the quality of the SiO films 14 and 16. $SiH_4$ gas flow rate:$CO_2$ gas flow rate in a standard condition may be 1:greater than 400, although the quality of the SiO films 14 and 16 is not improved. Accordingly, considering saving of $CO_2$ gas and capacity of the CVD device for supplying $CO_2$ gas as well, the ratio between the two gas flow rates is preferably 1:400 or less. Moreover, when $SiH_4$ gas flow rate:$CO_2$ gas flow rate is in the above range, each of the SiO films 14 and 16 has a growth rate in an appropriate range and also has a distribution width of the film thickness inside the wafer in a desired small range.

When the wafer heating temperature is lower than 350° C., the quality of the SiO films 14 and 16 tends to decrease. When the wafer heating temperature is higher than 500° C., since the thermal expansion rate of a Cu film of the wiring layer 11 is much higher than the thermal expansion rate of the first and second interlayer insulation films 13 and 15, a stress is exerted on the first and second interlayer insulation films 13 and 15, which increases risk of breakage. For preventing breakage of the low-k films, the wafer heating temperature is preferably in a range of 350° C.-450° C. The individual thickness of the SiO films 14 and 16 is in a range of, e.g., 10 nm-100 nm.

In the case of the related-art technique where TEOS films are used in place of the SiO films 14 and 16, the CVD devices used for forming the TEOS films are provided with vaporizing mechanisms for vaporizing liquid TEOS, and therefore can be used only for forming the TEOS films. On the other hand, the CVD device used in this embodiment does not need a vaporizing mechanism because the raw material used for forming the SiO films 14 and 16 is gas, i.e., $SiH_4$ gas and $CO_2$ gas. That is, the versatility of the CVD device used for forming the SiO films 14 and 16 in this embodiment is expanded. Accordingly, device costs and manufacturing costs can be reduced.

The thus obtained SiO films 14 and 16 do not contain nitrogen of nitrogen gas or nitrogen of ammonia gas because neither nitrogen gas nor ammonia gas is used. Accordingly, absorption of nitrogen-derived basic substances into the first and second interlayer insulation films 13 and 15 during formation of the SiO films 14 and 16 is avoided. Moreover, as described below in greater detail, the SiO films 14 and 16 themselves contain substantially no nitrogen or N—H containing basic substances. Therefore, the SiO films 14 and 16 do not allow basic substances to pass therethrough, and can prevent the basic substances from entering and diffusing in a resist film 20 (described later) even if the basic substances are contained in the first interlayer insulation film 13 or the second interlayer insulation film 15. Thus, poisoning is prevented.

The SiO films 14 and 16 have denser structures than the low-k films. However, by selecting SiOC films as the low-k films used as the first and second interlayer insulation films 13 and 15, tight contact is made between the SiO films 14 and 16 and the first and second interlayer insulation films 13 and 15, and the reliability of the semiconductor device is increased. This tight contact occurs because the SiO films 14 and 16 contain substantially the same elements as the SiOC films.

The antireflection film 18 may be made of an inorganic insulation film containing nitrogen such as a silicon nitride film. The antireflection film 18 is formed using a plasma CVD device while being supplied with mixed gas of $SiH_4$, $NH_3$ gas, and $N_2$ gas as a raw material. The antireflection film 18 is formed under conditions where, for example, the $SiH_4$ gas flow rate is 260 sccm, $NH_3$ gas flow rate is 240 sccm, $N_2$ gas flow rate is 900 sccm, pressure inside a processing chamber is 333 Pa (2.5 Torr), plasma input power is 120 W, and wafer heating temperature is 400° C. The silicon nitride film formed under these conditions has an attenuation coefficient of about 1.4 at the KrF excimer laser wavelength. As the coefficient of the silicon nitride film can be easily controlled by changing the ratio of the flow rates of the above gases, the antireflection film 18 may be formed to have a double layer structure of silicon nitride films having different attenuation coefficients. In that event, the attenuation coefficients of the lower layer and the upper layer at the KrF excimer laser wavelength are about 1.4 and about 0.6, respectively. The lower layer is formed under the above-described conditions, whereas the upper layer is formed under conditions where the $SiH_4$ gas flow rate is 155 sccm, $NH_3$ gas flow rate is 940 sccm, $N_2$ gas flow rate is 900 sccm, pressure inside the processing chamber is 400 Pa (3.0 Torr), plasma input power is 105 W, and wafer heating temperature is 400° C. Although the antireflection film 18 contains nitrogen, the SiO film 16 prevents $NH_3$ gas and $N_2$ gas from diffusing into the second interlayer insulation film 15 made of low-k film.

The SiO film 16 and the antireflection film 18 may be sequentially formed in the same processing chamber of the same plasma CVD device under the respective conditions. Since the raw materials for the SiO film 16 and the antireflection film 18 are gases only, the SiO film 16 and the antireflection film 18 can be easily formed by changing the gases used as raw materials. Moreover, since the SiO film 16 and the antireflection film 18 can be formed by the same plasma CVD device, device costs and manufacturing costs can be reduced.

Further, in the step shown in FIG. 2, a chemically amplified resist material is applied to the surface of the antireflection film 18 so as to form the resist film 20. The chemically amplified material used herein may be a resist material that is exposed by, e.g., far-ultraviolet rays, such as produced by a KrF excimer laser and an ArF excimer laser. Examples of such a chemically amplified resist material (positive type) include p-hydroxystyrene polymer esterified to t-butoxycarbonyl group as a photoreaction initiator, and p-hydroxystyrene polymer esterified with tetrahydropyranyl group as a photoreaction initiator. When the chemically amplified resist material is exposed to light, the photoreaction initiator is desorbed by acid generated by an acid generating agent. Thus, the remaining polymer becomes soluble in an alkaline developer.

Further, in the step shown in FIG. 2, a via hole pattern is exposed on the resist film 20 using, e.g., a KrF excimer laser (wavelength: 249 nm) producing far-ultraviolet rays. A latent image is thus formed on the resist film 20, and acid substances are formed. Since the SiO film 16 serving as an etching stopper layer is disposed between the resist film 20 and the second interlayer insulation film 15, the SiO film 16 prevents the basic substances from transferring from the second interlayer insulation film 15 to the resist film 20, thereby preventing poisoning.

Figure 3:
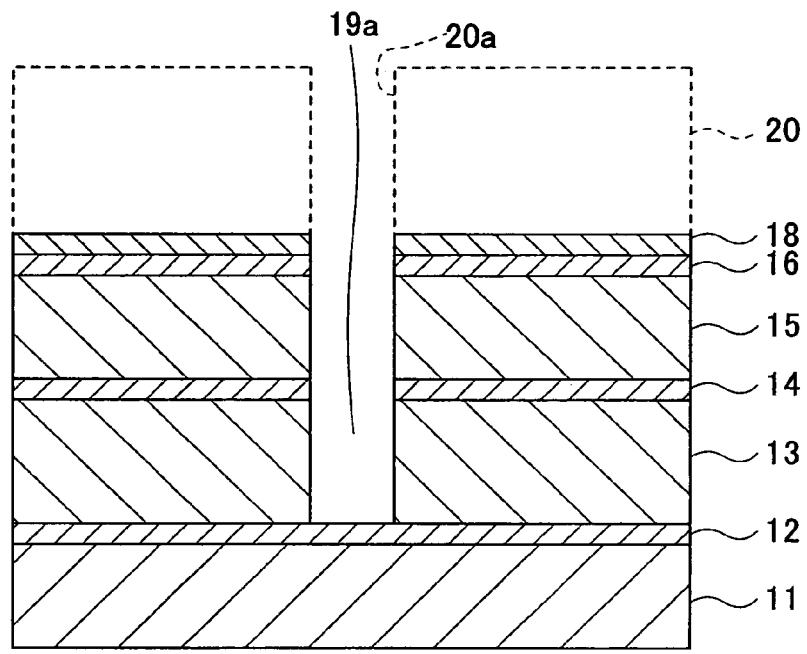

Then, in the step shown in FIG. 3, the resist film 20 is developed to form an opening 20a in a position where a via hole 19a is to be formed. Then, dry etching is performed to form the via hole 19a using, e.g., $CF_4$ gas and $O_2$ gas while masking with the resist film 20. The thus formed via hole 19a extends through the antireflection film 18, the SiO film 16, the second interlayer insulation film 15, the SiO film 14, and the first interlayer insulation film 13 such that the surface of the cap layer 12 is exposed. After that, the resist film 20 is removed.

Figure 4:
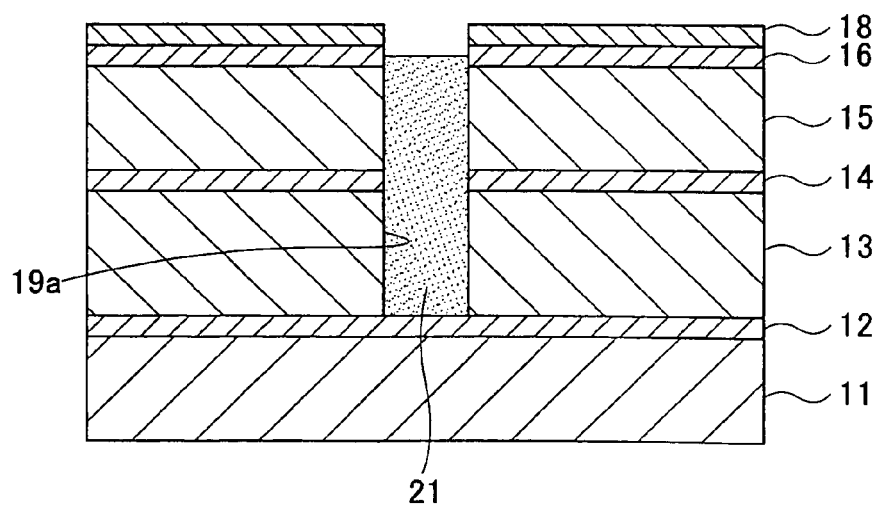

Then, in the step shown in FIG. 4, a filler 21 is added to cover the structure of FIG. 3 as well as to fill the via hole 19a. The filler 21 is made of a resin material such as a resist material. For example, the filler 21 may be made of a chemically amplified resist material. The chemically amplified resist material may be either positive type or negative type. Then, the structure is heated so as to cure the filler 21. There is no need to heat the structure if the filler 21 is fully cured without being heated.

Further, in the step shown in FIG. 4, the filler 21 on the antireflection film 18 is removed by dry etching. The filler 21 filling in the via hole 19a preferably has the surface at a level higher than the surface level of the second interlayer insulation film 15 and at a level lower than the surface level of the antireflection film 18 so as to prevent the side wall of the second interlayer insulation film 15 from being etched. The via hole 19a is therefore prevented from being enlarged in the lateral direction, so that fine vertical wiring is formed.

Figure 5:
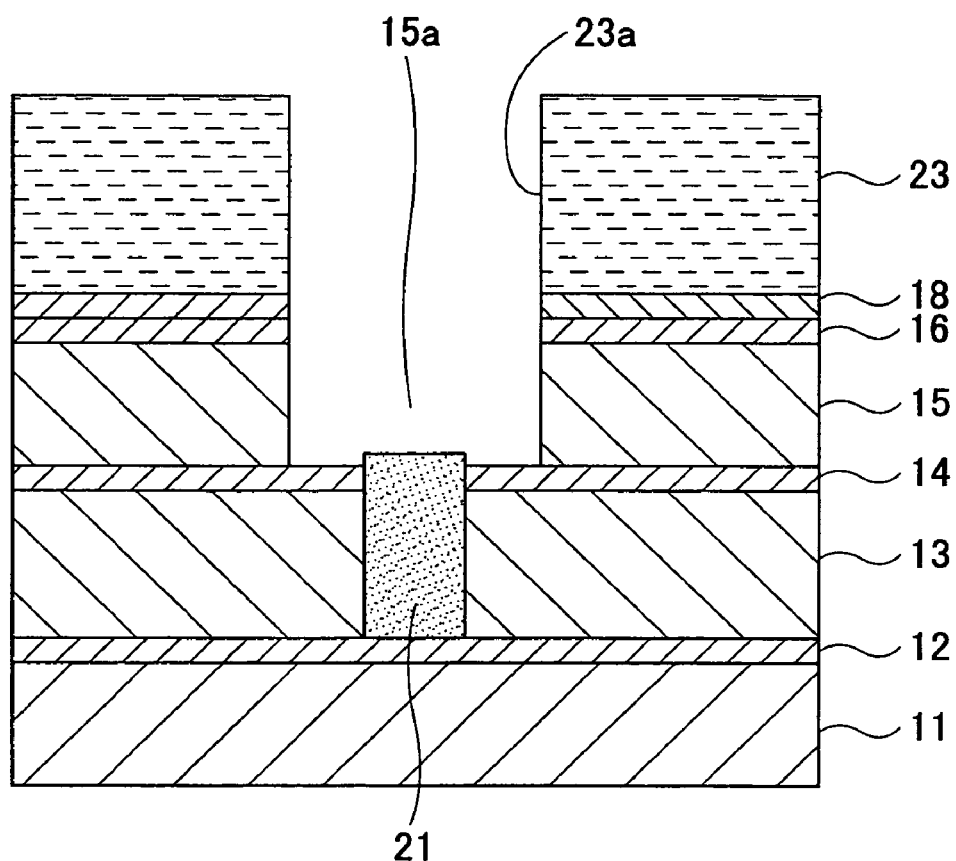

Then, in the step shown in FIG. 5, a resist film 23 is formed on the surface of the antireflection film 18. A pattern of a wiring groove 15a is exposed so as to form a latent image of the pattern on the resist film 23. After that, the structure is baked, e.g., at 130° C. for 90 seconds.

Further, in the step shown in FIG. 5, the resist film 23 is developed by a developer, such as tetramethylammonium hydroxide (TMAH), so that an opening 23a corresponding to the wiring groove 15a is formed.

Further, in the step shown in FIG. 5, the wiring groove 15a is formed by dry etching. More specifically, while being masked with the resist film 23, the antireflection film 18, the SiO film 16, and the second interlayer insulation film 15 are etched by using, e.g., $CF_4$ gas and $O_2$ so as to expose the surface of the SiO film 14. During the etching, the filler 21 is partly etched such that the surface level of the filler 21 is lowered to about the surface level of the SiO film 14.

Figure 6:
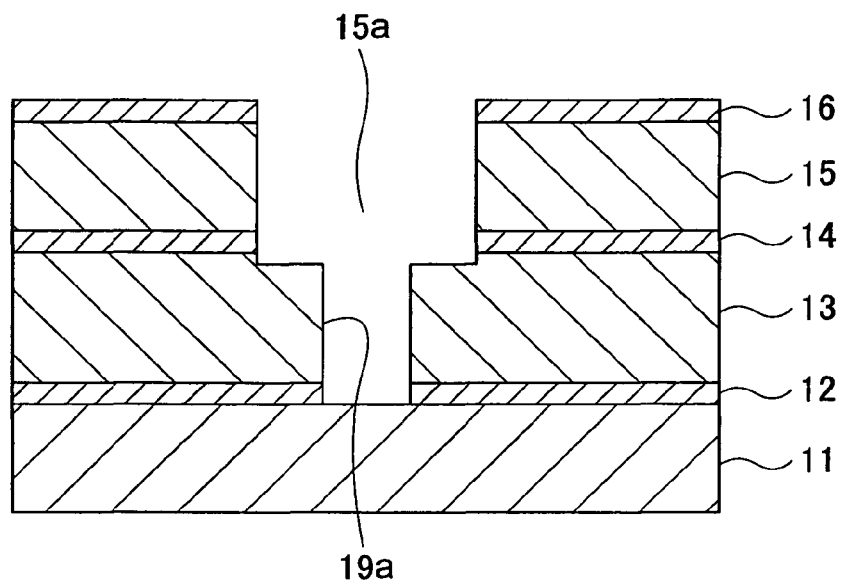

Then, in the step shown in FIG. 6, the resist film 23 and the filler 21 are removed by ashing. The cap layer 12 at the bottom of the via hole 19a, the SiO film 14 at the bottom of the wiring groove 15a, and the antireflection film 18 are then removed by dry etching, so that the surface of the wiring layer 11 is exposed.

Figure 7:
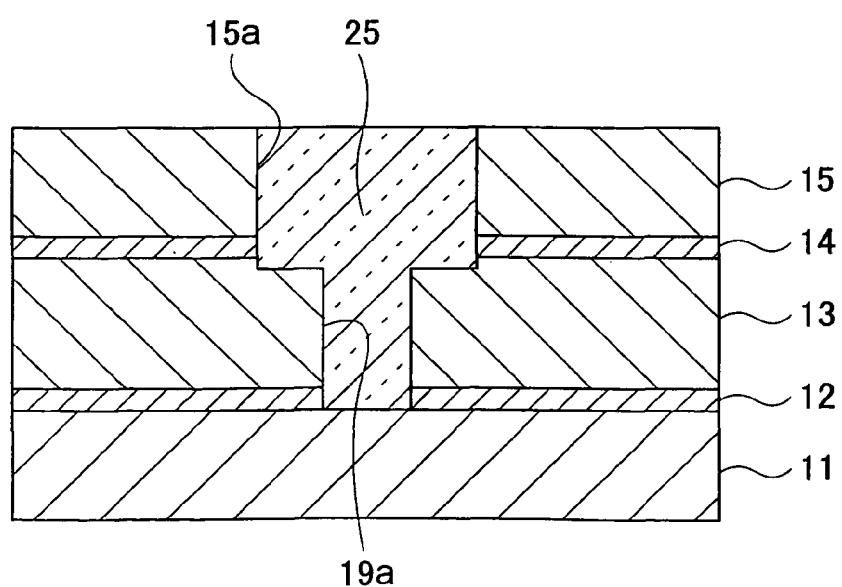

Then, in the step shown in FIG. 7, a barrier metal layer (not shown) made of, e.g., TiN film and a seed metal layer (not shown) made of, e.g., Cu film are sequentially formed on the side surfaces and the bottom surfaces of the via hole 19a and the wiring groove 15a by sputtering. Then, a Cu film 25 (or a CuAl film) is formed by plating to fill the wiring groove 15a and the via hole 19a as well as to cover the structure of FIG. 6. The surface of the Cu film 25 is polished by CMP. The polishing is stopped on the surface of the SiO film 16 which reduces the polishing speed compared to the Cu film 25. It is to be noted that the SiO film 16 may be removed by polishing as shown in FIG. 7 or may not be removed. With the steps described above, the wiring structure is formed using the dual damascene process.

According to the first embodiment, the surfaces of the first and second interlayer insulation films 13 and 15 made of low-k film are covered with the corresponding SiO films 14 and 16 formed by CVD using $SiH_4$ gas and $CO_2$ gas. Since neither $NH_3$ gas nor $N_2$ gas is used for forming the SiO films 14 and 16, the first and second interlayer insulation films 13 and 15 are prevented from being penetrated by these gases and ions therein during formation of the SiO films 14 and 16.

The SiO film 16 itself contains substantially no nitrogen, and therefore does not allow $NH_3$ gas, $N_2$ gas, and ions ionized from these gases to pass therethrough. That is, the SiO film 16 prevents $NH_3$ gas, $N_2$ gas, and ions ionized from these gases from entering the second interlayer insulation film 15 while the antireflection film 18 made of silicon nitride film is formed on the SiO film 16.

Accordingly, production of nitrogen-derived or N—H-derived basic substances in the second interlayer insulation film 15 is prevented, thereby preventing resist poisoning. As a result, the fine wiring structure is formed.

Since the SiO films 14 and 16 are formed using $SiH_4$ gas and $CO_2$ gas, there is no need to use a vaporizing mechanism, unlike the case of forming TEOS films where vaporizing mechanisms are used for vaporizing liquid TEOS used as a raw material for the TEOS films. Therefore, the plasma CVD device used for forming the SiO films 14 and 16 can also be used for forming other films such as the antireflection film 18. In other words, the versatility of the plasma CVD device used for forming the SiO films 14 and 16 is expanded. Moreover, the SiO film 16 and the antireflection film 18 can be sequentially formed in the same processing chamber by the same plasma CVD device. This simplification of production process can reduce manufacturing costs.

In the related-art technique, since $O_2$ gas used as an oxidizer for forming the TEOS films has high oxidizing power, reaction of mixed gas of vaporized TEOS and $O_2$ gas often causes dust in a pipe through which the mixed gas passes. The dust contaminates the processing chamber of the plasma CVD device, and consequently lowers production yield of semiconductor devices. In this embodiment, on the other hand, since $CO_2$ gas, which has a lower oxidizing power than $O_2$ gas, is used as an oxidizer for forming the SiO films 14 and 16, generation of dust can be reduced.

While both the first and second interlayer insulation films 13 and 15 are low-k films in the first embodiment, one of the first and second interlayer insulation films 13 and 15 may be made of low-k film and the other one may be a silicon oxide film, such as a TEOS film.

While the SiO films 14 and 16 also serve as etching stopper layers in the first embodiment, etching stopper layers may be separately provided on or under the corresponding SiO films 14 and 16. The etching stopper layers may be made of, for example, SiC films. The etching stopper layer may also be made of silicon nitride films. In that event, each of the SiO films 14 and 16 is formed to sandwich the corresponding silicon nitride film such that the silicon nitride films are kept out of direct contact with the first and the second interlayer insulation films 13 and 15. Thus, the SiO film 16 can prevent $NH_3$ gas, $N_2$ gas, and ions ionized from these gases from entering the first or second interlayer insulation film 13 or 15.

The following are specific examples of the first embodiment and comparative examples. In Example 1, composition analysis and measurements of properties, such as relative dielectric constant, were performed on the SiO film. In Comparative Examples 1 and 2, composition analysis and property measurements were performed on a TEOS film and a silicon oxide film containing nitrogen in the same manner as in Example 1 for comparison purpose.

Example 1

In Example 1, the SiO film was formed using the plasma CVD device. The thickness of the SiO film was set to 400 nm for the purpose of facilitating the analysis. The thickness of each of the TEOS film of Comparative Example 1 and the silicon oxide film of Comparative Example 2 was also set to 400 nm. The SiO film of Example 1 was formed under the following conditions.

$SiH_4$ gas flow rate: 50 sccm $CO_2$ gas flow rate: 10000 sccm

Pressure inside the processing chamber: 666 Pa (5 Torr)
Plasma input power: 500 W
Heating temperature: 400° C.

Comparative Example 1

In Comparative Example 1, which is not according to the present invention, the TEOS film having a thickness of 400 nm was formed. The composition analysis and the property measurements were performed in the same manner as in Example 1.

The TEOS film of Comparative Example 1 was formed under the following conditions.
TEOS liquid flow rate: 2 slm
$CO_2$ gas flow rate: 10000 sccm
Pressure inside the processing chamber: 666 Pa (5 Torr)
Heating temperature: 350° C.
Plasma input power: 1000 W Comparative Example 2

Figure 8:
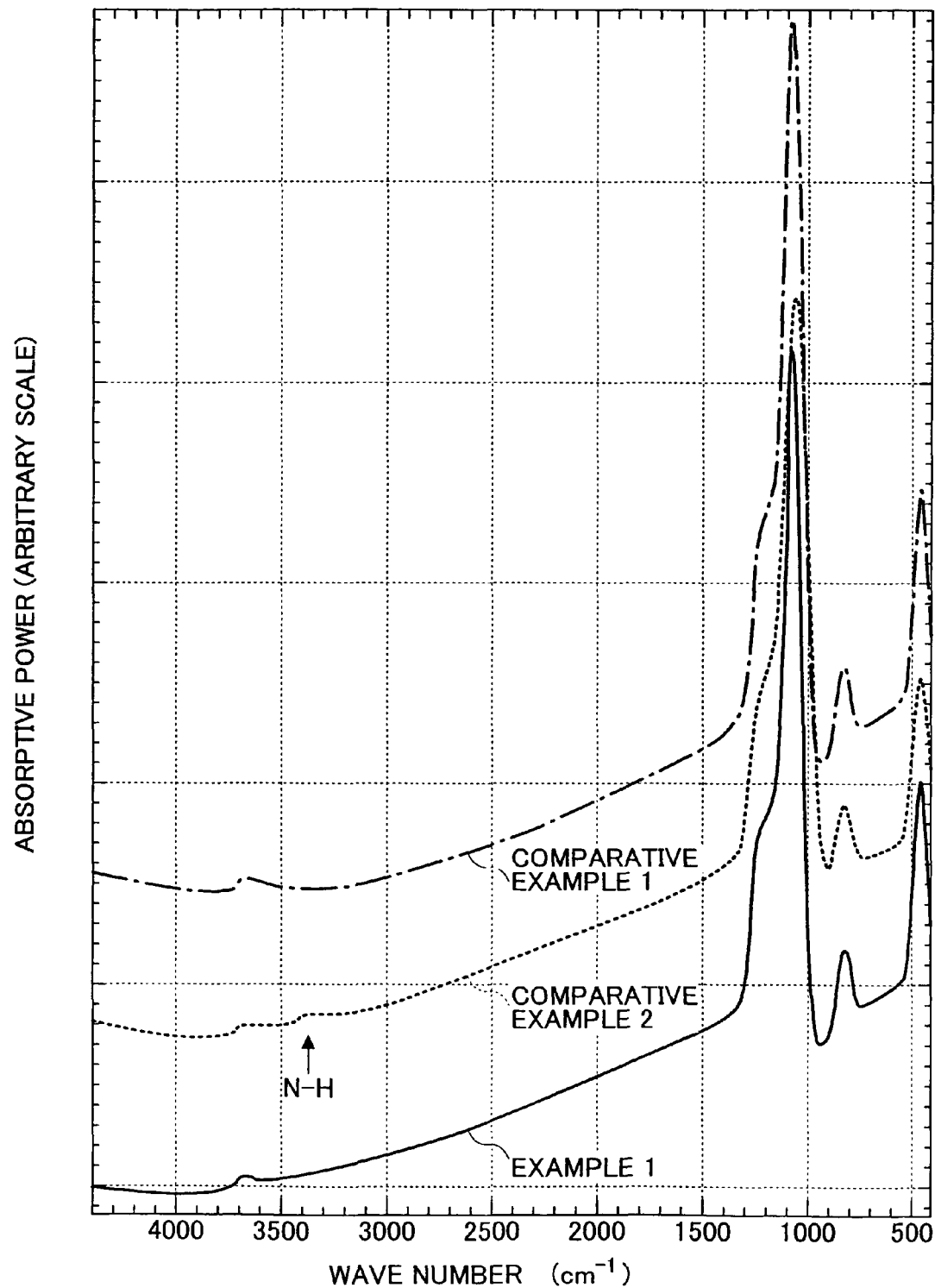
FIG. 8 is a chart showing infrared spectroscopy of silicon oxide films of Example 1 and Comparative Examples 1 and 2.

In Comparative Example 2, which is not according to the present invention, the silicon oxide film containing nitrogen and having a thickness of 400 nm was formed. The composition analysis and the property measurements were performed in the same manner as in Example 1. The silicon oxide film of Comparative Example 2 was formed under the following conditions.
$SiH_4$ gas flow rate: 150 sccm
$N_2O$ gas flow rate: 700 sccm
$N_2$ gas flow rate: 2000 sccm
Pressure inside the processing chamber: 666 Pa (5 Torr)
Heating temperature: 400° C.
Plasma input power: 500 W FIG. 8 is a chart showing infrared spectroscopy of Example 1 and Comparative Examples 1 and 2. Referring to FIG. 8, in the case of silicon oxide film of Comparative Example 2 using $SiH_4$ gas and $N_2O$ gas, absorption due to N—H stretching vibration was observed at about 3400 cm$^{-1}$. It is deduced from this result that the silicon oxide film of Comparative Example 2 allows absorption of N—H containing basic substances into the low-k film, and there is therefore a risk of resist poisoning. On the other hand, in the case of the SiO film of Example 1 and the TEOS film of Comparative Example 1, almost no absorption due to N—H stretching vibration was found. It is deduced from this result that each of the films of Example 1 and Comparative Example 1 contains fewer N—H groups than the film of Comparative Example 2, and the risk of resist poisoning in Example 1 and Comparative Example 1 is lower than Comparative Example 2.

FIG. 9 is a table showing composition of the silicon oxide films of Example 1 and Comparative Examples 1 and 2. Referring to FIG. 9, the result of composition analysis using X-ray photoelectron spectroscopy shows that the proportion of nitrogen contained in the film of Comparative Example 2 was 3.39%, whereas the proportions of nitrogen contained in the film of Example 1 and the film of Comparative Example 1 were much lower than in Comparative Example 2, which are 0.70% and 0.76%, respectively. It is found from this result as well that the risk of resist poisoning in Example 1 and Comparative Example 1 is low.

It is to be noted that the nitrogen in Example 1 and Comparative Example 1 is not derived from contamination in the processing chamber of the plasma CVD device. AXIS-His (Kratos Analytical Inc.) was used for the composition analysis, and the proportion (%) shown in FIG. 9 is expressed in atomic %.

FIG. 10 is a table showing properties of the silicon oxide films of Example 1 and Comparative Examples 1 and 2. As shown in FIG. 10, while the relative dielectric constant of the TEOS film of Comparative Example 1 was 4.33, the relative dielectric constant of the SiO film of Example 1 was 4.04, which is lower than that of Comparative Example 1. It is found from this result that the RC wiring delay in Example 1 is less than in the RC wiring delay in Comparative Example 1.

The density of the film of Example 1 was substantially the same as the density of the film of Comparative Example 1. In other words, there was no big density difference between the film of Example 1 and the film of Comparative Example 1. It is therefore deduced that capabilities of the films of Example 1 and Comparative Example 1 for preventing the passage of NH3 gas, N2 gas, ions ionized from these gases are almost at the same level.

Example 2

Figure 11:
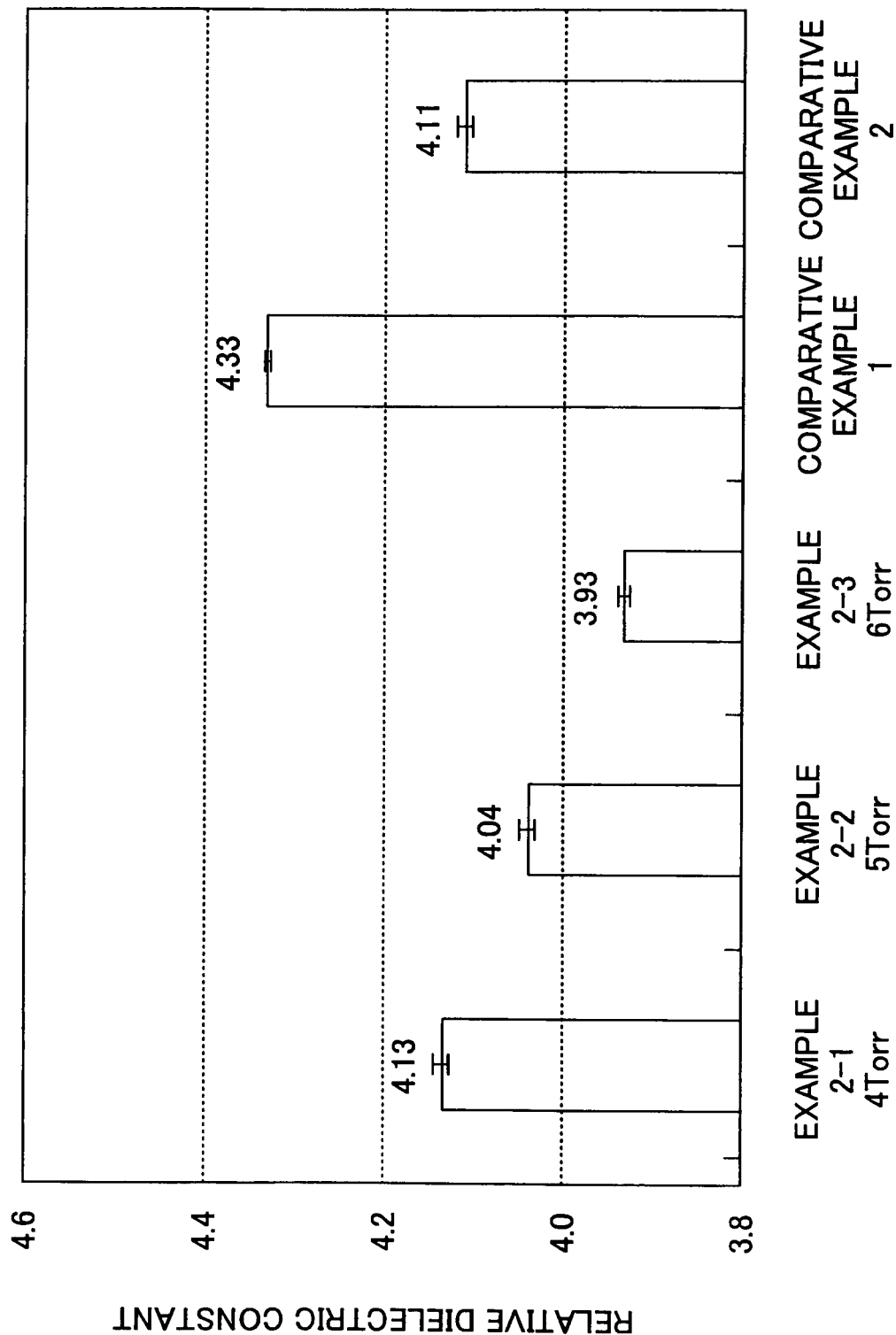
FIG. 11 is a graph showing a relationship between relative dielectric constant of a silicon oxide film of Example 2 and film forming pressure.

In Examples 2-1, 2-2, and 2-3, the SiO films were formed using the plasma CVD device while setting the pressure inside the processing chamber at different levels from 533 Pa to 800 Pa (4 Torr to 6 Torr). The pressures inside the processing chamber in Examples 2-1, 2-2, and 2-3 were 533 Pa (4 Torr), 666 Pa (5 Torr), and 800 Pa (6 Torr), respectively. Conditions applied to film formation in Examples 2-1-2-3 other than the pressure inside the processing chamber are as follows.
$SiH_4$ gas flow rate: 50 sccm
$CO_2$ gas flow rate: 10000 sccm
Heating temperature: 400° C.
Plasma input power: 500 W FIG. 11 is a graph showing a relationship between relative dielectric constant of the silicon oxide film and film forming pressure in Examples 2-1-2-3. The graph of FIG. 11 also shows the relative dielectric constants of the films of Comparative Examples 1 and 2 of FIG. 10 for explanation purposes.

As shown in FIG. 11, the relative dielectric constants of all the SiO films of Examples 2-1-2-3 were lower than the relative dielectric constant of the TEOS film of Comparative Example 1. That is, the relative dielectric constants of the SiO films formed at a film forming pressure in the range of 533 Pa-800 Pa (4 Torr-6 Torr) were lower than the TEOS film of Comparative Example 1. Accordingly, it is found that the SiO films of Examples 2-1-2-3 are more effective than the TEOS film of Comparative Example 1 in reducing wiring delay.

Example 3

In Examples 3-1, 3-2, 3-3, and 3-4, the SiO films were formed using the plasma CVD device while setting the plasma input power at different levels from 300 W to 600 W. The plasma input powers in Examples 3-1, 3-2, 3-3, and 3-4 were 300 W, 400 W, 500 W, and 600 W, respectively. Conditions applied to film formation in Examples 3-1-3-4 other than the plasma input power are as follows.
$SiH_4$ gas flow rate: 50 sccm
$CO_2$ gas flow rate: 10000 sccm
Pressure inside the processing chamber: 666 Pa (5 Torr)
Heating temperature: 400° C.

Figure 12:
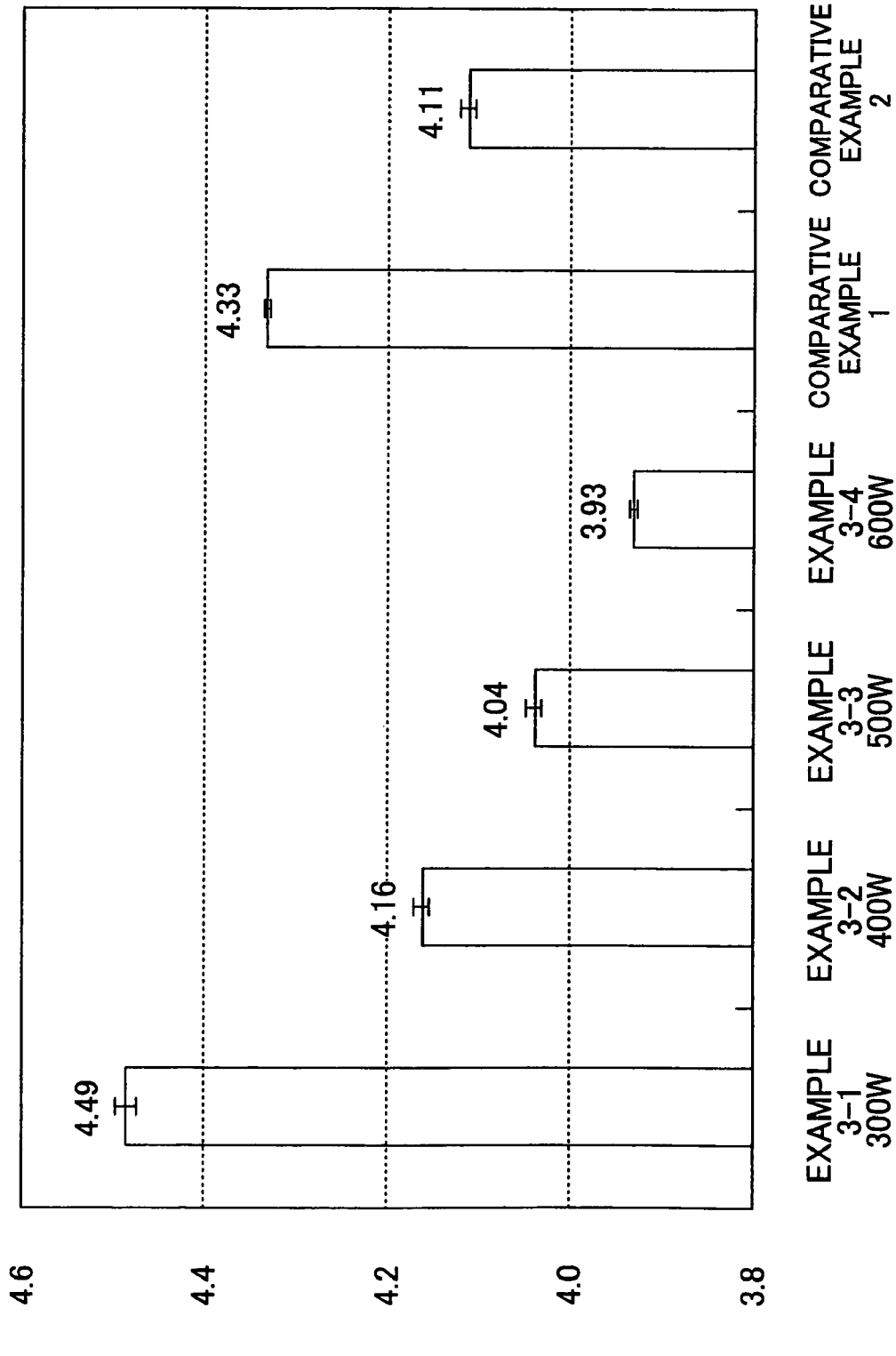
FIG. 12 is a graph showing a relationship between relative dielectric constant of the silicon oxide film of Example 3 and plasma input power.

FIG. 12 is a graph showing a relationship between relative dielectric constant of the SiO film and plasma input power in Examples 3-1-3-4. The graph of FIG. 12 also shows the relative dielectric constants of the films of Comparative Examples 1 and 2 of FIG. 10 for explanation purposes.

As shown in FIG. 12, the relative dielectric constants of all the SiO films of Examples 3-2-3-4 were lower than the relative dielectric constant of the TEOS film of Comparative Example 1. That is, the relative dielectric constants of the SiO films formed with a plasma input power in the range of 400 W-600 W are lower than the TEOS film of Comparative Example 1. Accordingly, it is found that the SiO films of Examples 3-2-3-4 are more effective than the TEOS film of Comparative Example 1 in reducing wiring delay.

Second Embodiment

A method of manufacturing a semiconductor device of a second embodiment of the present invention is almost the same as the method of manufacturing a semiconductor device of the first embodiment except that an SiO film 22 is formed under a resist film 23 for forming a wiring groove pattern.

Figure 13:
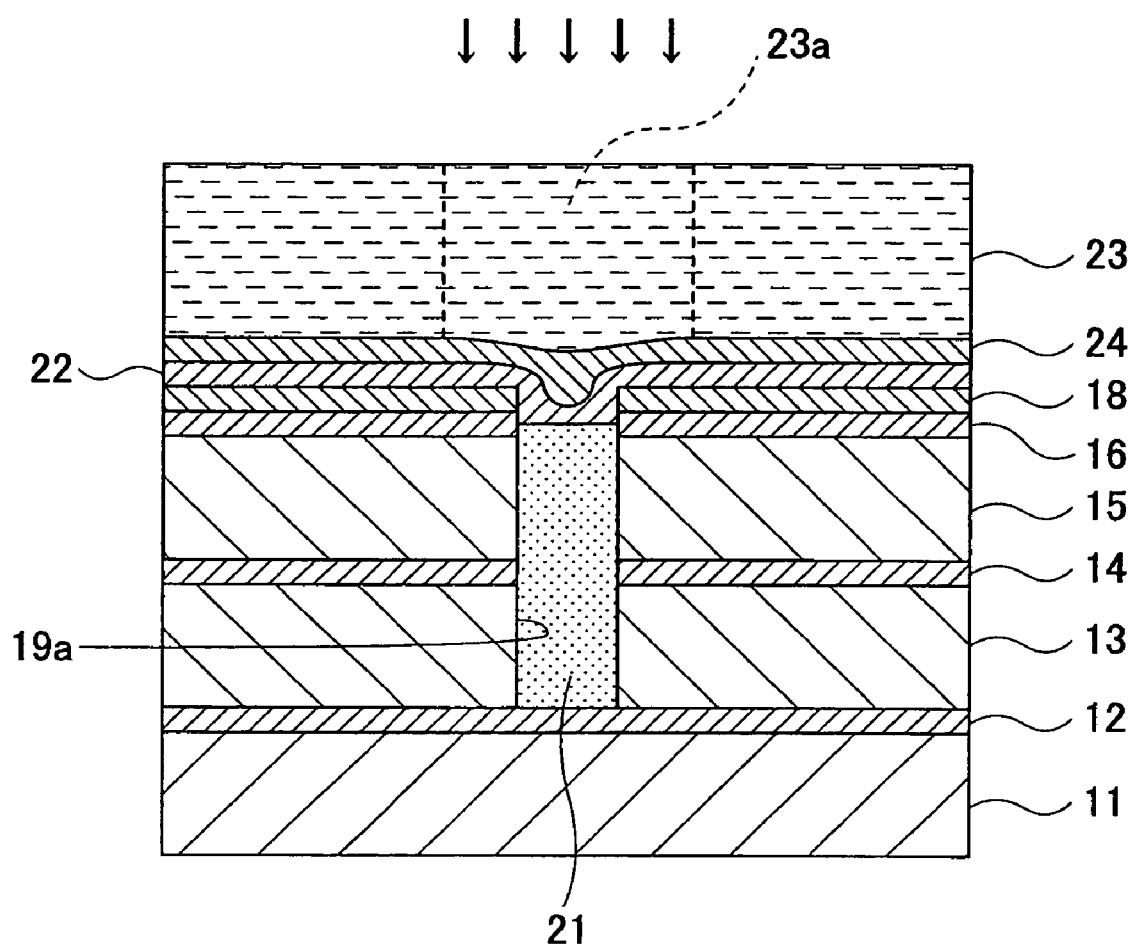
FIG. 13 illustrates a part of a manufacturing process of a semiconductor device according to a second embodiment of the present invention.

FIG. 13 illustrates a part of a manufacturing process of the semiconductor device according to the second embodiment of the present invention. The following describes the method of manufacturing the semiconductor device of the second embodiment with reference to FIGS. 2-4, 6, and 7 of the first embodiment, and FIG. 13.

According to the manufacturing process of the semiconductor device of the second embodiment, the steps shown in FIGS. 2-4 are first performed.

Then, in the step shown in FIG. 13, the SiO film 22 having a thickness of, e.g., 50 nm is formed on the surface of the structure of FIG. 4. The SiO film 22 is formed using the same method of forming the SiO films 14 and 16 of the first embodiment shown in FIG. 2. More specifically, the SiO film 22 is formed using a plasma CVD device while being supplied with mixed gas of $SiH_4$ and $CO_2$ as a raw material. The condition for forming the SiO film 22 is the same as the condition for forming the SiO films 14 and 16 of the first embodiment shown in FIG. 2.

Further, in the step shown in FIG. 13, an antireflection film 24 is formed to cover the SiO film 22. The antireflection film 24 is formed using the same method of forming the antireflection film 18 of the first embodiment shown in FIG. 2.

Further, in the step shown in FIG. 13, the resist film 23 is formed on the antireflection film, and a latent image corresponding to the pattern of the wiring groove is formed on the resist film 23. Then, the resist film 23 is developed to form the opening 23a. After that, the antireflection film 24, the SiO film 22, the antireflection film 18, the SiO film 16, and the second insulation layer 15 are etched while being masked with the resist film 23 with the opening 23a, so that the wiring groove is formed. Then, the same steps of FIGS. 5-7 are taken to form a wiring structure using the dual damascene process.

According to the second embodiment, since the SiO film 22 is formed on the surface of the filler 21, the basic substances absorbed in the first or the second interlayer insulation films 13 or 15 during formation and cleaning of the via hole 19a are prevented from reaching the resist film 23 through the filler 21. As the resist poisoning is thus prevented, a fine wiring structure is formed. Moreover, since the antireflection film 24 is formed on the surface of the SiO film 22, the reflection light returning to the resist film 23 upon the exposure of the wiring groove pattern is reduced, thereby making the wiring structure finer. Although it is preferable to provide the antireflection film 24, the antireflection film 24 may be unnecessary if the width of the wiring groove is wide enough.

While the present invention has been described in terms of preferred embodiments, it will be apparent to those skilled in the art that variations and modifications may be made without departing from the scope of the invention as set forth in the accompanying claims.

For instance, the dual damascene process used when forming the SiO films in the first and second embodiments includes forming wiring grooves after forming via holes, but other dual damascene processes may be used. The SiO films of the present invention are not limited to SiO films formed using the dual damascene process, and may be widely used as protective films for interlayer insulation films, especially for interlayer insulation films made of low-k materials.

What is claimed is:

1. A method of manufacturing a semiconductor device comprising a wiring structure formed using a dual damascene process, comprising;
   sequentially forming a first interlayer insulation film and a second interlayer insulation film, at least one of the first and second interlayer insulation films being made of a low dielectric constant material;
   forming a first silicon oxide film by CVD using $SiH_4$ gas and $CO_2$ gas over the second interlayer insulation film;
   forming a first antireflection film containing nitrogen by CVD;
   forming a first chemically amplified resist film to cover the first silicon oxide film;
   forming a pattern of an opening in a position over the first chemically amplified resist film;
   forming a via hole to extend through the first silicon oxide film, the first interlayer insulation film, and the second interlayer insulation film, while using the pattern formed over the first chemically amplified resist film as a mask;
   filling the via hole with a filler;
   forming a second silicon oxide film by CVD using $SiH_4$ gas and $CO_2$ gas over the first antireflection film and the filler;
   forming a second antireflection film containing nitrogen by CVD;
   forming a second chemically amplified resist film to cover the second antireflection film;
   forming a pattern of a wiring groove in an area of the second chemically amplified resist film including the via hole;
   forming the wiring groove by etching the second interlayer insulation film while using the second chemically amplified resist film as a mask; and
   filling the via hole and the wiring groove with a conductive material.

2. The method of manufacturing a semiconductor device according to claim 1, wherein at least one of the first antireflection film and the second antireflection film includes a silicon nitride film.

3. The method of manufacturing a semiconductor device according to claim 2, wherein at least one of the first antireflection film and the second antireflection film is formed by plasma CVD using $SiH_4$ gas, $NH_3$ gas, and $N_2$ gas.

4. The method of manufacturing a semiconductor device according to claim 2, wherein at least one of the first silicon oxide film and the second silicon oxide film is formed in the same processing chamber as the first antireflection film and the second antireflection chamber, respectively.

* * * * *